United States Patent
Micheloni et al.

(10) Patent No.: US 6,327,184 B1
(45) Date of Patent: Dec. 4, 2001

(54) READ CIRCUIT FOR A NONVOLATILE MEMORY

(75) Inventors: Rino Micheloni, Turate; Giovanni Campardo, Bergamo; Luca Crippa, Busnago, all of (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/621,019

(22) Filed: Jul. 21, 2000

(30) Foreign Application Priority Data

Jul. 22, 1999 (EP) .................................. 99830469

(51) Int. Cl.[7] .................................................. G11C 16/06
(52) U.S. Cl. ................................. 365/185.2; 365/185.21
(58) Field of Search .......................... 365/185.2, 185.21, 365/185.01, 207, 189.01

(56) References Cited

U.S. PATENT DOCUMENTS

| | | | |
|---|---|---|---|
| 4,223,394 | * 9/1980 | Pathak et al. | 365/210 |
| 5,386,158 | * 1/1995 | Wang | 327/21 |
| 5,946,238 | * 8/1999 | Campardo et al. | 365/185.2 |
| 5,986,937 | * 11/1999 | Yero | 365/185.21 |
| 6,181,602 | * 1/2001 | Campardo et al. | 365/185.21 |

FOREIGN PATENT DOCUMENTS

| | | | |
|---|---|---|---|
| 0 284 091 A2 | 9/1988 | (EP) | G11C/7/00 |
| 0 359 561 A2 | 3/1990 | (EP) | G11C/7/00 |
| 0 398 048 A2 | 11/1990 | (EP) | G11C/16/02 |
| 0 740 307 A1 | 10/1996 | (EP) | G11C/16/06 |
| 0 814 484 A1 | 12/1997 | (EP) | G11C/16/06 |

\* cited by examiner

*Primary Examiner*—Hoai V. Ho
(74) *Attorney, Agent, or Firm*—Lisa K. Jorgenson; Robert Iannucci; Seed IP Law Group PLLC

(57) ABSTRACT

The read circuit comprises an array branch having an input array node connected, via an array bit line, to an array cell; a reference branch having an input reference node connected, via a reference bit line, to a reference cell; a current-to-voltage converter connected to an output array node of the array branch and to an output reference node of the reference branch to supply on the output array node and the output reference node the respective electric potentials correlated to the currents flowing in the array memory cell and, respectively, in the reference memory cell; and a comparator connected at input to the output array node and output reference node and supplying as output a signal indicative of the contents stored in the array memory cell; and an array decoupling stage arranged between the input array node and the output array node to decouple the electric potentials of the input and output array nodes from one another.

10 Claims, 3 Drawing Sheets

READ CIRCUIT FOR A NONVOLATILE MEMORY

TECHNICAL FIELD

The present invention relates to a read circuit for a nonvolatile memory.

BACKGROUND OF THE INVENTION

As is known, in a floating gate nonvolatile memory cell, storage of a logic state is carried out by programming the threshold voltage of the cell itself through the definition of the quantity of electric charge stored in the floating gate region.

According to the information stored, memory cells may be distinguished into erased memory cells (logic state stored "1"), in which no electric charge is stored in the floating gate region, and written or programmed memory cells (logic state stored "0"), in which an electric charge is stored in the floating gate region that is sufficient to determine a sensible increase in the threshold voltage of the memory cell itself.

The most widespread method for reading nonvolatile memory cells envisages the comparison between a quantity correlated to the current flowing through the memory cell to be read and a similar quantity correlated to the current flowing through a memory cell having known contents.

In particular, to carry out reading of a memory cell, a read voltage is supplied to the gate terminal of the memory cell which has a value comprised between the threshold voltage of an erased memory cell and that of a written memory cell, in such a way that, if the memory cell is written, the read voltage is lower than the threshold voltage, and hence no current flows in the memory cell itself, whereas, if the memory cell is erased, the read voltage is higher than the threshold voltage, and hence current flows in the cell.

Reading of a memory cell is carried out by a read circuit known as "sense amplifier", which, in addition to recognizing the logic state stored in the memory cell, also provides for the correct biasing of the drain terminal of the memory cell.

A read circuit for a nonvolatile memory is, for example, described in the European Patent Application EP-A-0814480 filed on Jun. 18, 1996 in the name of the present applicant.

According to what is illustrated in FIG. 1, the sense amplifier, indicated as a whole by the reference number 1, comprises a supply line 2 set at the supply voltage $V_{cc}$; a ground line 4 set at the ground voltage $V_{GND}$; an array branch 6 connected, through an array bit line 8, to a nonvolatile array memory cell 10 the contents of which it is desired to read; a reference branch 12 connected, through a reference bit line 14, to a nonvolatile reference memory cell 16 the contents of which are known; a current-to-voltage converting stage 18 connected to the array branch 6 and reference branch 12 to convert the currents flowing in the array memory cell 10 and in the reference memory cell 16 into respective electric potentials; and a differential comparator stage 19 having the purpose of comparing these electric potentials and supplying at an output an output logic signal OUT indicative of the binary information "0" or "1" stored in the array memory cell 10.

In particular, the array cell 10 and reference cell 16 have drain terminals receiving the same read signal $V_{READ}$, drain terminals connected to the array bit line 8 and, respectively, to the reference bit line 14, and source terminals connected to the ground line 4.

The array branch 6 comprises an array column decoding block 20 connected between a node 22 (hereinafter indicated by the term "input array node 22") and the array bit line 8, and is made up of three NMOS transistors 24, 26, 28 connected in series and receiving on gate terminals respective column decoding signals HM, HN, HO, whilst the reference branch 12 comprises a reference column decoding block 30 connected between a node 32 (hereinafter indicated by the term "input reference node 32") and the reference bit line 14, and is formed of three NMOS transistors 34, 36, 38 connected in series, having gate terminals connected to the supply line 2 and having the purpose of setting the drain terminal of the reference memory cell 16 in the same load conditions as the drain terminal of the array memory cell 10.

The array branch 6 and the reference branch 12 comprise an array biasing stage 40 and, respectively, a reference biasing stage 42 having the purpose of biasing at a preset potential, typically 1 V, the input array node 22 and, respectively, the input reference node 32.

The array biasing stage 40 and the reference biasing stage 42 have an identical circuit structure and each comprise a fedback cascode structure formed of an NMOS transistor 44 and an NMOS transistor 46, respectively, and of a regulator 48 and a regulator 50, respectively. In particular, the NMOS transistors 44 and 46 have source terminals connected, on the one hand, to the input terminals of respective regulators 48 and 50, and, on the other, to the array bit line 8 and, respectively, to the reference bit line 14, drain terminals connected to the current-to-voltage converter stage 18, and gate terminals connected to the output terminals of the respective regulators 48, 50.

The current-to-voltage converter stage 18 consists of a current mirror having the purpose of carrying out the above mentioned current-to-voltage conversion and comprising a first diode-connected PMOS transistor 52 arranged on the array branch 6, and a second PMOS transistor 54 arranged on the reference branch 12. In particular, the PMOS transistors 52 and 54 have gate terminals connected together and to the drain terminal of the PMOS transistor 52, source and bulk terminals connected to the supply line 2, and drain terminals connected, respectively, to the drain terminal of the NMOS transistor 44 and the drain terminal of the NMOS transistor 46 and defining respective nodes 56, 58, hereinafter indicated by the term "output array node 56 and output reference node 58".

The array branch 6 and the reference branch 12 further comprise an array precharging stage 60 and, respectively, a reference precharging stage 62, which have the purpose of precharging the output array node 56 and, respectively, the output reference node 58 through respective current paths arranged in parallel to the current path defined by the current-to-voltage converter stage 18.

In particular, the array precharging stage 60 and the reference precharging stage 62 are designed in such a way as to be able to supply, for the precharging of the output array node 56 and the output reference node 58, and hence of the parasitic capacitances associated to said nodes, a much larger current than the one which, on account of their reduced size, the PMOS transistors 52 and 54 of the current-to-voltage converter stage 18 are able to supply, so enabling the precharging phase of these nodes to be speeded up considerably.

In detail, the array precharging stage 60 and the reference precharging stage 62 present an identical circuit structure and each comprise a PMOS transistor 64 and, respectively, a PMOS transistor 66, and an NMOS transistor 68 and, respectively, an NMOS transistor 70, having high conductivity, that is, a high W/L ratio, connected in series and arranged between the supply line 2 and the output array node 56 and, respectively, between the supply line 2 and the output reference node 58.

In particular, the PMOS transistors 64 and 66 have source terminals and bulk terminals connected to the supply line 2, gate terminals connected to the ground line 4, and drain terminals connected to the drain terminal of the NMOS transistor 68 and, respectively, to the drain terminal of the NMOS transistor 70; the said NMOS transistors 68 and 70 in turn have gate terminals receiving one and the same precharging signal SP, bulk terminals connected to the ground line 4, and source terminals connected to the output array node 56 and, respectively, to the output reference node 58.

The comparator stage 19 has a non-inverting input terminal connected to the output array node 56 and an inverting input terminal connected to the output reference node 58, and supplies, on an output terminal, the output signal OUT.

Finally, the sense amplifier 1 comprises an equalization stage formed of an NMOS transistor 72 having drain terminal connected to the output reference node 58 and source terminal connected to the output array node 56, bulk terminal connected to the ground line 4, and gate terminal receiving an equalization signal SEQ having the purpose of issuing a command for turning on the NMOS transistor 72 only during the phase of equalization of the output array node 56 and the output reference node 58, in order to short-circuit the aforesaid nodes together to set them at one and the same equalization potential.

Also connected to the array bit line 8 is a plurality of array cells arranged on the same array column, the said cells being schematically represented in FIG. 1 by an array equivalent capacitor 74, which, for convenience of description, is represented as being directly connected to the input array node 22, and the capacitance of which typically has values of 2–3 pF.

For a detailed description of the operation of the sense amplifier 1 and of the advantages that it makes possible, see the aforementioned patent application. Here it is emphasized that the main difference between the sense amplifier 1 described in the above mentioned patent application and the sense amplifiers according to the prior art lies in the fact that in the sense amplifier 1 described above it is the PMOS transistor 52, to which the array branch 6 is connected, that is diode-connected, whereas in the prior art the sense amplifier it is the PMOS transistor 54, to which the reference branch 12 is connected, that is diode-connected.

In the sense amplifier 1 it is therefore the current generated by the array memory cell 10 that is mirrored on the reference branch 12, i.e., multiplied by a mirror factor N, whereas, in the known art, it is the current generated by the reference memory cell 16 that is mirrored on the array branch 6, and this substantial difference enables reading of the array cells to be carried out also in the presence of low supply voltages without extending the read times as compared to the operating conditions in which the supply voltage is high.

With the amplification of the current flowing in the array memory cell 10, the use of the classic equalization network, which envisages the use of a transistor that turns on only during the precharging and equalization phases to short-circuit the output array node 56 and the output reference node 58, may no longer be sufficient when the aim is to obtain particularly reduced read times at low supply voltages.

In particular, unlike what occurs in the sense amplifiers according to the known art, the read times that can be obtained with the sense amplifier 1 described above at low supply voltages are markedly influenced by an erroneous definition of the equalization potential of the output array node 56.

In fact, if for example the equalization potential to which the output array node 56 is brought during the equalization phase is greater than a preset reference value, and in particular is such that the gate-source voltage of the NMOS transistors 52, 54 of the current-to-voltage converter stage 18 is lower than the threshold voltage of the transistors themselves, the latter are off, and hence, when the equalization phase is terminated, no current is drained on the array branch 6. Consequently, the potentials of the output array node 56 and the output reference node 58 start to evolve as if the array memory cell 10 were written; i.e., the potential of the output array node 56 starts to increase, while the potential of the output reference node 58 starts to decrease.

If, however, the array memory cell 10 is erased, at a certain point the NMOS transistors 52, 54 of the current-to-voltage converter stage 18 turn on, and thus the potential of the output array node 56 stops increasing and starts to decrease. When the potential of the output array node 56 is lower than the potential of the output reference node 58, the output signal OUT supplied by the comparator stage 19 then switches correctly to a high logic level.

If a too low equalization potential is chosen, the opposite problem is instead encountered. In fact, if the equalization potential to which the output array node 56 is brought during the equalization phase is lower than a preset reference value, in particular such that the gate-source voltage of the NMOS transistors 52, 54 of the current-to-voltage converter 18 is greater than the threshold voltage of the transistors themselves, the latter are overdriven, and the potentials of the output array node 56 and output reference node 58 then tend to evolve as if the array memory cell were erased; i.e., the potential of the output array node 56 starts to decrease at a rate faster than that at which the potential of the output reference node 58 decreases. Also contributing to this evolution is the array equivalent capacitor 76, which, in so far as it continues to drain current, simulates the presence of an erased cell.

If, however, the array memory cell 10 is written, at a certain point the potential of the output array node 56 stops decreasing and starts to increase. Also in this case, then, before a written array memory cell can be read, it is necessary to wait for the potential of the output array node 56 to reacquire the right value, with consequent dilation of the read time.

The problems of dilation of read times resulting from an incorrect definition of the equalization potential of the output array node 56 are moreover accentuated in the sense amplifier 1 described above by the fact that associated to the input array node 22 is the somewhat high (a few pF) capacitance of the array equivalent capacitor 76, and by the fact that, with the circuit structure of the sense amplifier 1 described above, in which it is the current drained by the array memory cell 10 that is mirrored on the reference branch 12, the current that flows in the array branch 6 is lower than the current that flows in the reference branch 12.

FIG. 2 is a graphic representation of the consequences deriving from an incorrect definition of the equalization potential at a value higher than the above mentioned preset reference value for an erased array memory cell.

In particular, FIG. 2 shows the plots versus time of the equalization signal SEQ and of the precharging signal SP, of the potentials $V_M$ and $V_R$ of the output array node 56 and of the output reference node 58 respectively, of the potential $V_P$ of the input array node 22, and of the output signal OUT of the comparator stage 19 both during the equalization and precharging phases and during the read phase of an erased array memory cell.

During the equalization and precharging phases (in which the equalization signal SEQ and the precharging signal SP assume a high logic level), the potentials $V_M$ and $V_R$, of the output array node 56 and of the output reference node 58 respectively, assume a value equal to the supply voltage $V_{CC}$ decreased by a value equal to the threshold voltage of a PMOS transistor, the potential $V_P$ of the input array node 22 assumes a value equal to 1 V, whilst the output signal OUT supplied by the comparator stage 19 assumes an intermediate value equal to approximately one half of that of the supply voltage $V_{CC}$.

Once the equalization and precharging phases are concluded (switching pulse edge of the equalization signal SEQ and of the precharging signal SP), the potential $V_R$ of the output reference node 58 starts to decrease, whilst the potential $V_M$ of the output array node 56 erroneously starts to increase. Consequently, the output signal OUT supplied by the comparator stage 19 and indicative of the binary information stored in the array memory cell 10 erroneously switches to a low logic level, which is indicative of a written memory cell.

During this anomalous initial transient, the input array node 22 is discharged by the current flowing in the array branch 6, and its potential $V_P$ decreases slowly towards a value lower than 1 V; in particular, the potential $V_P$ of the input array node 22 decreases by an amount such as to enable the regulator 48 to supply to the gate terminal of the NMOS transistor 44 a voltage increment sufficient for discharging the output array node 56.

When the potential $V_P$ of the input array node 22 has dropped by a quantity that is sufficient for the NMOS transistor 44 to be able to discharge the output array node 56 and to bring the potential $V_M$ of the said node to a value lower than the potential $V_R$ of the output reference node 58, the output signal OUT supplied by the comparator stage 19 correctly switches to a high logic level indicative of an erased array memory cell.

From what has been described above, it is therefore evident that the time required for discharging the output array node 56, and hence for arriving at a correct reading of the binary information stored in the array memory cell 10, is markedly affected by the duration of the discharging transient of the input array node 22 by means of the current supplied by the array memory cell.

Given, however, that associated to the input array node 22 is a capacitance of a few pF of the array equivalent capacitor 76 and given that, with the circuit structure of the sense amplifier 1 described above (in which it is the current drained from the array memory cell 10 that is mirrored on the reference branch 12), the current flowing in the array branch 6 is not typically very high, and the duration of the discharging transient of the input array node 22 is relatively high, thus considerably limiting the reduction of read times at low supply voltages.

SUMMARY OF THE INVENTION

According to principles of the present invention, a read circuit is provided for a nonvolatile memory cell. The read circuit includes a decoupling stage connected between the bit line and the sense amplifier. The decoupling stage permits the input array to be decoupled from the sense amplifier on a selected basis.

BRIEF DESCRIPTION OF THE DRAWINGS

For a better understanding of the present invention, a preferred embodiment thereof will now be described, simply in order to provide a non-limiting example, with reference to the attached drawings, in which.

DETAILED DESCRIPTION OF THE INVENTION

Figure 3:
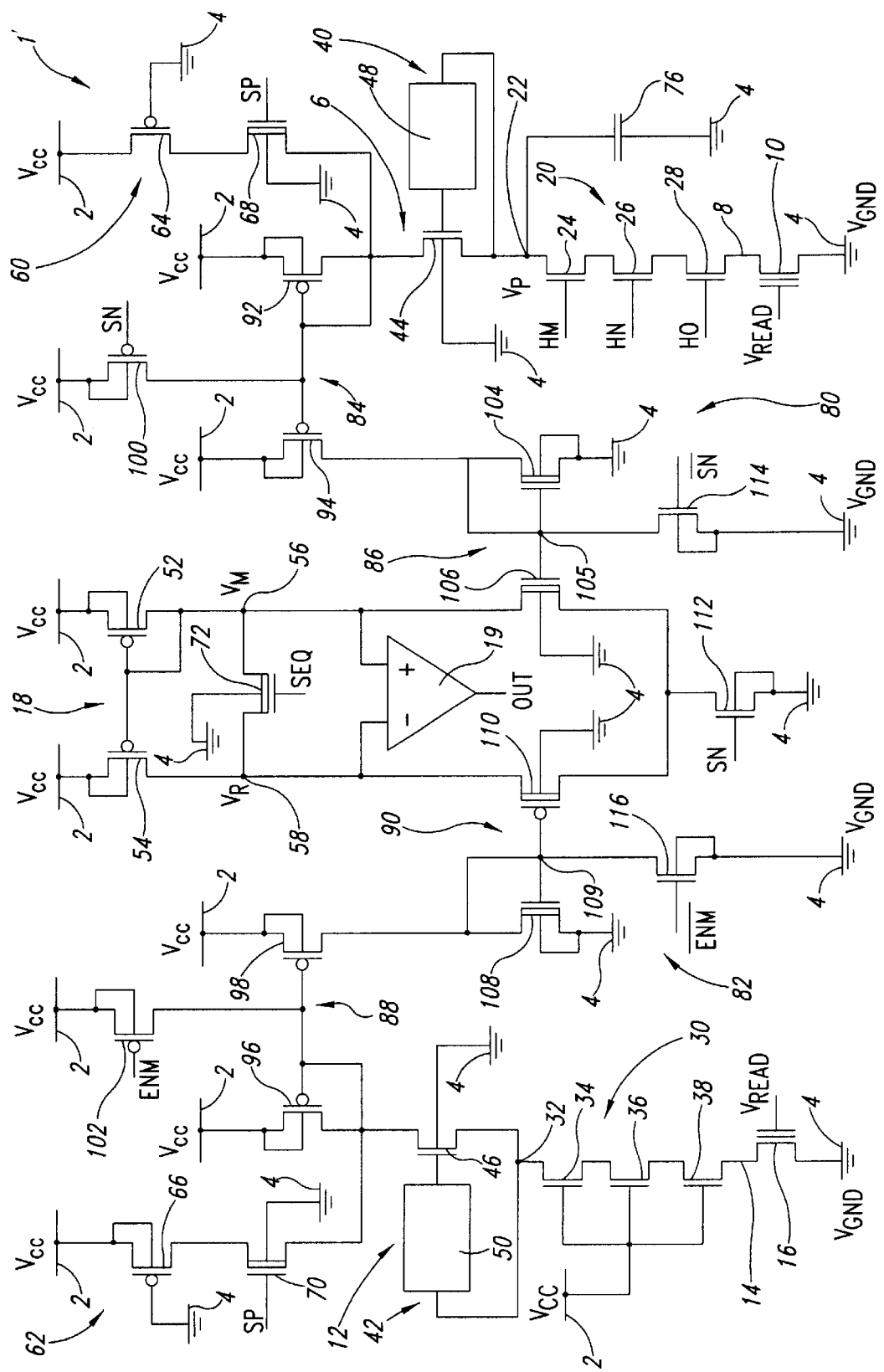
FIG. 3 shows a circuit diagram of a sense amplifier according to the present invention.

In FIG. 3, the reference 1' designates, as a whole, a sense amplifier according to the present invention.

The sense amplifier 1' has some portion of the circuit that are similar to that of the sense amplifier 1 described previously, consequently the parts that are identical to those of the sense amplifier 1 will be designated by the same reference numbers. The sense amplifier of the present invention differs from the latter in that it further comprises an array decoupling stage 80 arranged between the output array node 56 and the array biasing stage 40, and a reference decoupling stage 82 arranged between the output reference node 58 and the reference biasing stage 42, the said stages 80 and 82 having the purpose of rendering the potentials of the output array node 56 and the output reference node 58 independent of the potentials of the input array node 22 and, respectively, of the input reference node 32.

In particular, the array decoupling stage 80 and the reference decoupling stage 82 have identical circuit structures and each comprise first and second current mirrors 84, 86 and, respectively, 88, 90, cascaded between the drain terminal of the NMOS transistor 44, respectively 46, and the output array node 56, respectively the output reference node 58.

In detail, the first current mirrors 84 and 88 each comprise a first PMOS transistor 92 and a second PMOS transistor 94, respectively 96, 98, having gate terminals connected together and to the drain terminal of the PMOS transistor 92, respectively 96, and source and bulk terminals connected to the supply line 2. The PMOS transistors 92 and 96 moreover have drain terminals connected to the drain terminals of the NMOS transistor 44 and, respectively, of the NMOS transistor 46.

Each one of the first current mirrors 84 and 88 further comprises a third PMOS transistor 100, respectively 102, having gate terminal receiving a first enabling signal SN, respectively a second enabling signal ENM, source and bulk terminals connected to the supply line 2, and drain terminals connected to the gate terminals of the PMOS transistors 92, 94, respectively 96, 98.

The second current mirrors 86 and 90 each comprise a first NMOS transistor 104 and a second NMOS transistor 106, respectively 108, 110, having gate terminals connected together and to the drain terminal of the NMOS transistor 104, respectively 108, and defining a node 105, respectively 109, and source and bulk terminals connected to the ground line 4. The NMOS transistors 104 and 108 moreover have drain terminals connected to the drain terminals of the PMOS transistor 94 and, respectively, of the PMOS transistor 98, whilst the NMOS transistors 106 and 110 have drain terminals connected to the output array node 56 and, respectively, to the output reference node 58, bulk terminals connected to the ground line 4, and source terminals connected to the drain terminal of a transistor 112, which in turn has gate terminal receiving the first enabling signal SN and source and bulk terminals connected to the ground line 4.

Each one of the second current mirrors 84 and 88 further comprises a third NMOS transistor 114, respectively 116, having gate terminal receiving the first negated enabling signal $\overline{SN}$, respectively the second negated enabling signal $\overline{ENM}$, bulk and source terminals connected to the ground line 4 and drain terminal connected to the node 105, respectively 109.

The operation of the sense amplifier 1' will now be described solely as regards the array decoupling stage 80 and the reference decoupling stage 82, since the operation of the rest of the circuit is already known from the aforementioned European patent application.

In particular, the current mirrors 84 and 88 perform the function of decoupling the output array node 56 and the output reference node 58 from the input array node 22 and the input reference node 32 and, through the transistors 104 and 108, the current flowing in the array branch 6 is converted into a potential on the node 105, and the current flowing in the reference branch 12 is converted into a potential on the node 109.

The NMOS transistors 106, 110, connected in differential mode, thus carry out, jointly with the PMOS transistors 52, 54 which constitute their loads, the voltage comparison between the potentials of the nodes 105 and 109, and hence the output array node 56, which now is totally disengaged from the input array node 22 and from the capacitance associated thereto, can be quickly brought to a steady state value according to the voltage unbalancing between the nodes 105 and 109 themselves.

The PMOS transistors 100, 102 and the NMOS transistors 112, 114 and 116 perform secondary functions. In particular, the PMOS transistors 100 and 102 have the sole function of turning off the current mirrors 84 and 88 when the enabling signals SN and ENM assume a low logic level, the said current mirrors 84 and 88 consequently determining turning off of the current mirrors 86 and 90, and thus considerable energy saving is achieved. The NMOS transistors 114 and 116, which are counterphase controlled with respect to the PMOS transistors 100 and 102, in that they receive, on their gate terminals, the negated enabling signals $\overline{SN}$, $\overline{ENM}$, have the function, when they are on, of bringing the nodes 105 and 109 back to the ground voltage $V_{GND}$; whilst the NMOS transistor 112, which is phase controlled together with the PMOS transistors 100, 102, in that it receives on gate terminal the enabling signal SN, has the function of turning off the current-to-voltage converter stage 18 and the transistors 106 and 110, which are connected in differential configuration, as well as the function of increasing the common mode rejection ratio (CMRR) of the transistors 106 and 110.

Figure 1:
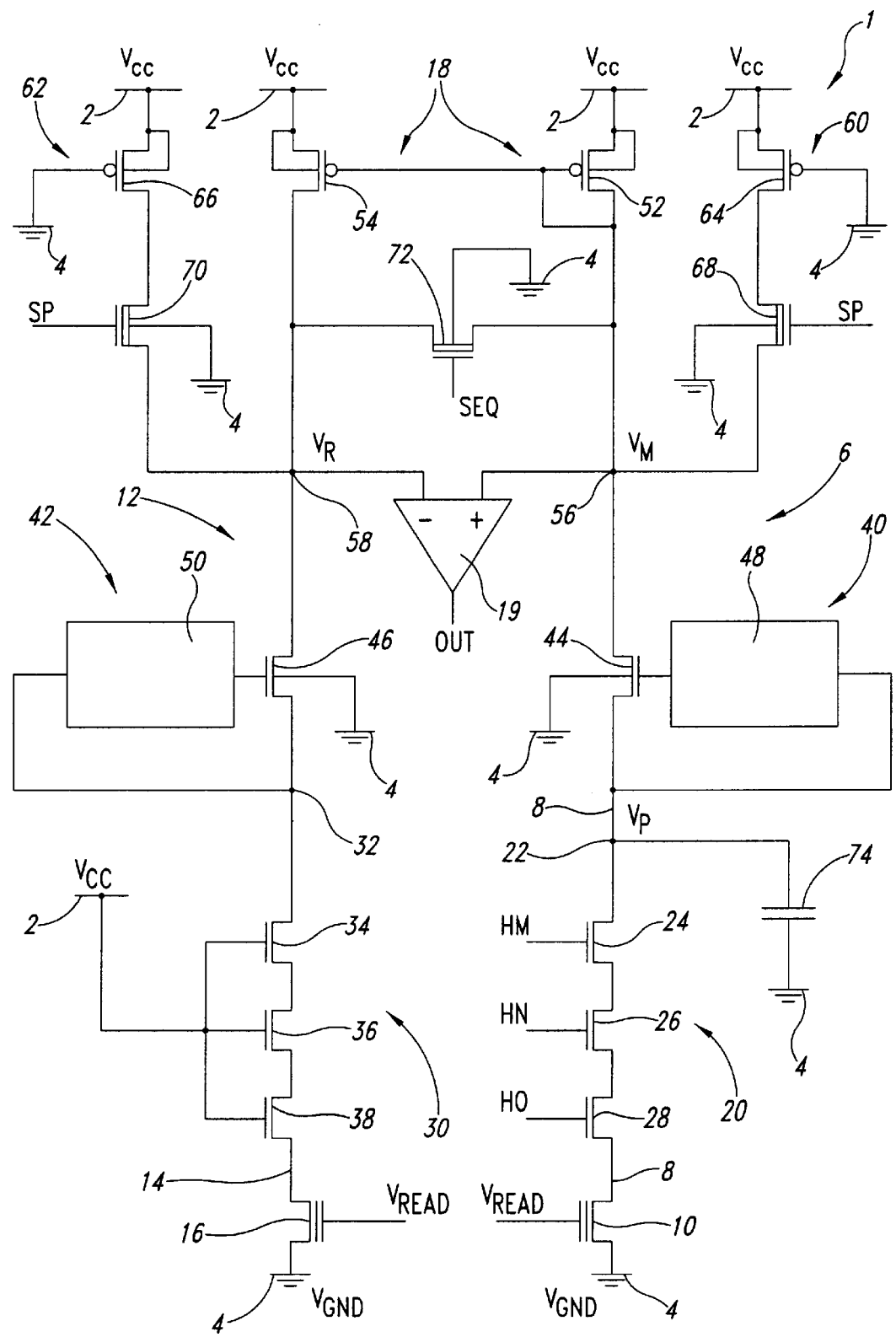
FIG. 1 shows a circuit diagram of a known sense amplifier.
Figure 2:
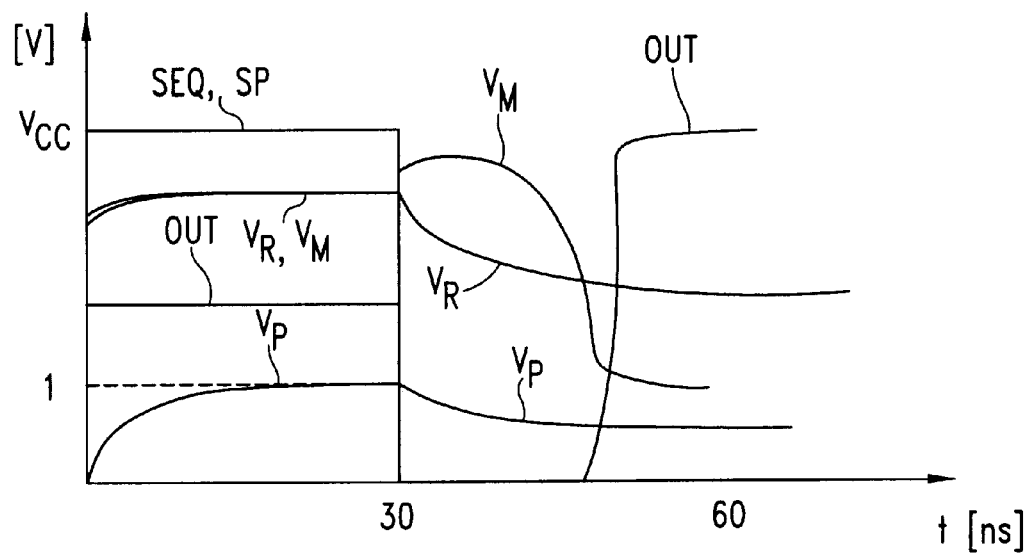
FIG. 2 shows plots of electrical quantities of the sense amplifier of FIG. 1 versus time.
Figure 4:
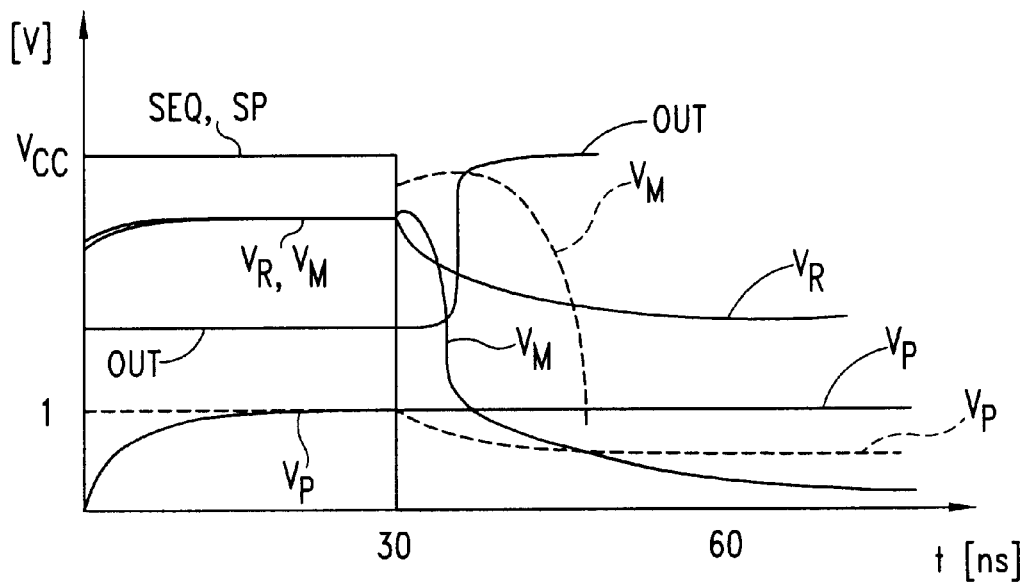
FIG. 4 shows plots of electrical quantities of the sense amplifier of FIG. 3 versus time.

FIG. 4 graphically highlights the advantage that the present invention makes possible as regards total reading time in the same operating conditions as those considered in FIG. 2, i.e., in the case of an incorrect definition of the equalization potential at a value higher than the aforementioned preset reference value and in the case of an erased array memory cell.

In particular, FIG. 4 is similar to FIG. 2 and shows, with continuous lines, the plots versus time of the equalization signal SEQ, of the precharging signal SP, of the potentials $V_M$ of the output array node 56 and $V_R$ of the output reference node 58, of the potential $V_P$ of the input array node 22, and of the output signal OUT of the comparator stage 19 for a sense amplifier according to the present invention, and, for comparison, with dashed lines, the plots versus time, already shown in FIG. 2, of the potential $V_M$ of the output array node 56 and of the potential $V_P$ of the input array node 22 for a traditional sense amplifier.

As may be noted in this figure by comparing the continuous lines with the dashed lines, with the use of the circuit solution according to the present invention a reduction in the potential $V_M$ of the output array node 56 is obtained that is decidedly faster than that obtained in a traditional sense amplifier. Consequently, in the sense amplifier according to the present invention, the instant in which the potentials $V_M$ and $V_R$, of the output array node 56 and of the output reference node 58 respectively, intercross, and in which switching of the output signal OUT occurs, is clearly anticipated with respect to the case of a traditional sense amplifier, with consequent considerable reduction in total read time.

In addition, it may also be noted how the plot of the potential $V_M$ of the output array node 56 is altogether uncorrelated with the plot of the potential $V_P$ of the input array node 22, which even after termination of the equalization phase remains constant at 1 V.

A further advantage of the sense amplifier according to the present invention is that of enabling amplification as desired of the currents flowing in the array memory cell 10 and in the reference memory cell 16 through the mirror ratios of the transistors 94, 98, 106, and 110, thus enabling further reduction in the time required for discharging the output array node 56.

The advantages of the sense amplifier 1' according to the present invention are evident from what has been described previously.

Finally, it is clear that modifications and variations may be made to the sense amplifier 1' described and illustrated herein, without thereby departing from the sphere of protection of the present invention.

For example, in the sense amplifier 1', the diode connection present in the current-to-voltage converter stage 18 could also be made in a traditional way on the PMOS transistor 54 connected to the output reference node 58, instead of on the PMOS transistor 52 connected to the output array node 56, in order to be able to exploit the advantages of traditional current-to-voltage converters.

Furthermore, the circuit structure of the sense amplifier 1' could be simplified by eliminating the NMOS transistors 106, 110 and the PMOS transistors 52 and 54 of the current-to-voltage converter stage 18 and by connecting the comparator stage 19 directly to the nodes 105 and 109. According to this variant, then, the NMOS transistors 104 and 108 would perform the current-to-voltage conversion function, and the nodes 105 and 109 would consequently define the output array node and the output reference node, respectively.

This simplified structure could be further modified by connecting the NMOS transistors 104 and 108 together in such a way that they define a current mirror, i.e., by connecting the gate terminals of the NMOS transistors 104 and 108 together and by diode-connecting just one of these transistors, and then connecting the inverting terminal and the non-inverting terminal of the comparator stage 19 respectively to the drain terminal of the NMOS transistor 104 and to the drain terminal of the NMOS transistor 108.

Finally, the circuit structure of the sense amplifier 1' could be further simplified by eliminating also the reference decoupling stage 82, at the expense, however, of a loss of symmetry in the circuit structure itself.

What is claimed is:

1. A read circuit for a nonvolatile memory cell, comprising:
   - a first reference line at a first reference potential and a second reference line at a second reference potential;
   - an array branch having an input array node connectable, via an array bit line, to an array memory cell the contents of which it is desired to read;
   - a reference branch having an input reference node connectable, via a reference bit line, to a reference memory cell the contents of which are known;
   - an output array node and an output reference node;
   - a current-to-voltage converter circuit connected to said output array node and output reference node to supply, on the output array node and output reference node, respective electric potentials correlated to the currents flowing in said array memory cell and, respectively, in said reference memory cell;
   - a comparator circuit having an input connected to said output array and output reference nodes and outputting a signal indicative of the contents stored in said array memory cell; and
   - an array decoupling circuit arranged between said input array node and said output array node to decouple from one another the electric potentials of the input and output array nodes.

2. The read circuit according to claim 1, wherein said array decoupling means comprise at least first current mirror means.

3. The read circuit according to claim 2, wherein said first current mirror means comprise a first transistor and a second transistor having first terminals connected to said input array node and, respectively, to said output array node, and second terminals connected to said first reference line, and control terminals connected together and to the first terminal of said first transistor.

4. The read circuit according to claim 3, wherein said array decoupling means further comprise second current mirror means arranged between said first current mirror means and said output array node.

5. The read circuit according to claim 4, wherein said second current mirror means comprise a third transistor and a fourth transistor having first terminals connected to said first terminal of said second transistor and, respectively, to said output array node, second terminals connected to said second reference line, and control terminals connected together and to the first terminal of said third transistor.

6. The read circuit according to claim 1, wherein it further comprises reference decoupling means arranged between said input reference node and said output reference node to decouple from one another the electric potentials of the input and output reference nodes.

7. The read circuit according to claim 6, wherein said reference decoupling means comprise at least third current mirror means.

8. The read circuit according to claim 7, wherein said current mirror means comprise a fifth transistor and a sixth transistor having first terminals connected to said input reference node and, respectively, to said output reference node, second terminals connected to said first reference line 2, and control terminals connected together and to the first terminal of said fifth transistor.

9. The read circuit according to claim 8, wherein said reference decoupling means further comprise fourth current mirror means arranged between said third current mirror means and said output reference node.

10. The read circuit according to claim 9, wherein said fourth current mirror means comprise a seventh transistor and an eighth transistor having first terminals connected to said first terminal of said sixth transistor and, respectively, to said output reference node, second terminals connected to said second reference line, and control terminals connected together and to the first terminal of said seventh transistor.

* * * * *